US012250794B2

(12) United States Patent
Lancaster et al.

(10) Patent No.: US 12,250,794 B2
(45) Date of Patent: *Mar. 11, 2025

(54) MODULAR DATA CENTER

(71) Applicant: Soluna Holdings, Inc., Albany, NY (US)

(72) Inventors: Nicholaus Ray Lancaster, Albany, NY (US); Dipul Patel, Albany, NY (US)

(73) Assignee: Soluna Holdings, Inc., Albany, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/620,807

(22) Filed: Mar. 28, 2024

(65) Prior Publication Data
US 2024/0244799 A1    Jul. 18, 2024

Related U.S. Application Data

(63) Continuation of application No. 17/867,315, filed on Jul. 18, 2022, now Pat. No. 11,974,415.

(60) Provisional application No. 63/223,275, filed on Jul. 19, 2021.

(51) Int. Cl.
*H05K 7/20* (2006.01)
*G06F 1/20* (2006.01)

(52) U.S. Cl.
CPC .......... *H05K 7/20745* (2013.01); *G06F 1/20* (2013.01); *H05K 7/20145* (2013.01)

(58) Field of Classification Search
CPC .......... H05K 7/20745; H05K 7/20736; H05K 7/2079; H05K 7/20709; H05K 7/20781; H05K 7/1497; H05K 7/20827; H05K 7/20145; H05K 7/20272; H05K 7/1488; H05K 7/20754; H05K 7/20181; H05K 7/20818; H05K 7/20136; H05K 7/2059; H05K 7/1485; H05K 7/20127; H05K 7/18; H05K 7/20718; G06F 1/20; G06F 1/16
USPC ..................................................... 361/679.51
See application file for complete search history.

(56) References Cited

U.S. PATENT DOCUMENTS

| 2007/0064383 A1* | 3/2007 | Tanaka | G11B 15/6835 361/679.33 |
| 2009/0153993 A1* | 6/2009 | Garcia | G11B 17/22 360/31 |
| 2012/0162906 A1* | 6/2012 | Jai | H05K 7/20745 361/679.53 |

(Continued)

*Primary Examiner* — Mandeep S Buttar
(74) *Attorney, Agent, or Firm* — Nutter, McClennen & Fish, LLP

(57) ABSTRACT

A data center in an environment has modules. Each module has a housing and an air mover. The housing contains processing devices that generate heat during operation. Each module has an air inlet on a first side of the housing and receives air from the environment. Each module also has an air outlet on a second side of the housing to exhaust air from the housing. At least three modules are spaced apart to form lateral spaces between adjacent modules. The modules form an interior region to receive the exhausted air of the modules. Each air mover generates a pressure differential between a top portion of the interior region and a bottom portion of the interior region using the exhausted air. The lateral spaces reduce the pressure differential between the top portion of the interior region and the bottom portion of the interior region.

23 Claims, 7 Drawing Sheets
(4 of 7 Drawing Sheet(s) Filed in Color)

(56) References Cited

U.S. PATENT DOCUMENTS

| | | | |
|---|---|---|---|
| 2013/0120931 A1* | 5/2013 | Sankar | G06F 1/181 |
| | | | 361/679.48 |
| 2016/0249484 A1* | 8/2016 | Parizeau | H05K 7/20745 |
| 2016/0270263 A1* | 9/2016 | Crawford | H04L 41/0803 |
| 2017/0126505 A1* | 5/2017 | Cencini | H05K 5/0069 |
| 2019/0110378 A1* | 4/2019 | Gold | G11B 15/00 |
| 2022/0124934 A1* | 4/2022 | Baldwin | H05K 7/20736 |

\* cited by examiner

MODULAR DATA CENTER

PRIORITY

This patent application claims priority from provisional U.S. patent application No. 63/223,275, filed Jul. 19, 2021, entitled, "MODULAR DATA CENTER," and naming Nicholaus Ray Lancaster and Dipul Patel as inventors, and U.S. patent application Ser. No. 17/867,315, filed Jul. 18, 2022, entitled, "MODULAR DATA CENTER," and naming Nicholaus Ray Lancaster and Dipul Patel as inventors the disclosure of each of which is incorporated herein, in its entirety, by reference.

GOVERNMENT RIGHTS

None

FIELD

Illustrative embodiments generally relate to data centers and, more particularly, various embodiments relate to managing thermal profiles of data centers.

BACKGROUND

Data centers are buildings or groups of buildings utilized by enterprises to house computer systems and associated components that contain critical applications and data. A data center typically supports a variety of business applications and activities, including email and file sharing, artificial intelligence, machine learning, and communications services. These activities are enabled through the infrastructure for network connectivity, central processing, and data storage within the data center.

To those ends, data center building(s) typically house computers and servers, telecommunication and storage systems, and security systems. Data centers also require large amounts of electricity to operate. Accordingly, to keep the facility running at optimal capacity and reliability, the building(s) also typically equipped with environmental controls, such as ventilation and cooling systems, as well as redundant-capacity components. Undesirably, increased temperatures in data centers can cause equipment malfunction and reduce the overall life of the equipment.

SUMMARY

In accordance with one embodiment of the invention, a data center configured to be positioned in an environment (e.g., an open space) has a plurality of modules. Among other things, each module has a housing and an air mover. The housing contains processing devices that generate heat during operation. Each module has an air inlet positioned on a first side of the housing and receives air from the environment. Each module also has an air outlet positioned on a second side of the housing to exhaust air from the housing using the air mover. At least three modules of the plurality of modules are spaced apart to form lateral spaces between adjacent modules. The plurality of modules form an interior region to receive the exhausted air of the at least three modules. Each air mover generates a pressure differential between a top portion of the interior region and a bottom portion of the interior region using the exhausted air. The lateral spaces reduce the pressure differential between the top portion of the interior region and the bottom portion of the interior region.

Preferably, the modules are positioned in the environment so that the interior region has a pressure that is substantially the same as the environmental pressure. To mitigate backflow of outlet air into the inlet, at least two of the modules have a sloped roof with an interior edge and an exterior edge. The interior edge is adjacent or extending into the interior region, while the exterior edge is outside of the interior region (i.e., the interior edge is closer to the interior region). The interior edge is lower (i.e., it has a higher altitude) than the altitude of the exterior edge. Correspondingly, each air inlet may be consider to have a top inlet edge while each air outlet may be considered to have a top outlet edge. As noted above, the air outlets of the modules direct air flow into the interior region and the air inlets are spaced from the interior region. The top outlet edge of each module preferably is lower in altitude than its respective top inlet edge. Each of the modules may be considered to have a top roof portion—perhaps including the noted exterior edge of the roof. In this and other embodiments, the modules define the interior region at least in part with the at least one lateral space. To facilitate air flow, at least one lateral space is lower in altitude than the top roof portions of the plurality of modules.

As a further safeguard to mitigate recirculation of exhausted air from the given air outlet back to the given air inlet, a given module has an air buffer adjacent to its air inlet. Moreover, for convective airflow, each module may have an outlet air mover to direct air from the air inlet, through the housing and out the air outlet upwardly at an angle of between one and ninety degrees to the horizontal within the interior region. Further to manage air flow, the system may have flow diverter within the interior region to direct outlet air upwardly.

The air outlet of each of the three or more modules may be on one side of their respective housings to form part of the interior region. Those in the art may shape the interior region to have a number of shapes, such as a rectangle, diamond, or rhombus. To mitigate the amplitude of the sound of air flowing through the air outlet, some modules may have plurality of baffles (e.g., at the inputs).

The data center may have a plurality of additional modules that forms a plurality of other interior spaces. For example, each of the plurality of additional modules may have its own housing (referred to as an "additional housing") and interior (referred to as an "additional interior") configured to contain a plurality of additional processing devices that generate heat during operation. The plurality of additional modules form second and third interior regions. To more effectively manage winds, the interior regions preferably are positioned in an offset, nonlinear pattern.

In accordance with another embodiment of the invention, a data center is configured to be positioned in an environment. The data center has at least three modules to contain processing devices, each of the at least three modules being adjacent to two other modules to form lateral spaces. The at least three modules are positioned in the environment to form an interior region. The interior region forms a plurality of concavities defined by the at least three modules. Each module has a sloped roof extending at an angle upwardly from the interior region, the sloped roof converging in a direction of the interior region with roofs of other modules forming the interior region. Each module has an air mover to urge airflow from a first side of the module and exhaust air directly into the interior region by way of a second side of the module. The air mover generates a pressure differential between a top portion of the interior region and a bottom portion of the interior region using the exhausted air. The lateral spaces reduce the pressure differential between the top portion of the interior region and the bottom portion of the interior region.

In accordance with another embodiment of the invention, there is a method of thermally managing a data center having a plurality of modules in an environment forming an interior region with at least one lateral space. The method receives air from the environment via a plurality of air inlets exposed to the environment and spaced from the interior region, the plurality of air inlets being positioned on a first side of each the plurality of modules. The method directs the received air through the plurality of modules to absorb heat from processing devices that generate heat, a temperature of the received air increasing as it absorbs heat to produce heated air. The method forces the heated air directly from the plurality of modules into the interior region by way of a plurality of air outlets, the plurality of air outlets being positioned on a second side of the plurality of modules. The method generates a pressure differential between a between a top portion of the interior region and a bottom portion of the interior region in response to forcing the heated air into the interior region. The method reduces the pressure differential between the top portion of the interior region and the bottom portion of the interior region by transferring at least a portion of the heated air from the interior region into the environment using the at least one lateral space.

BRIEF DESCRIPTION OF THE DRAWINGS

Those skilled in the art should more fully appreciate advantages of various embodiments of the invention from the following "Description of Illustrative Embodiments," discussed with reference to the drawings summarized immediately below.

The patent or application file contains at least one drawing executed in color. Copies of this patent or patent application publication with color drawing(s) will be provided by the Office upon request and payment of the necessary fee.

DESCRIPTION OF ILLUSTRATIVE EMBODIMENTS

In illustrative embodiments, three or more modules of a data center are oriented and configured to form an interior region for efficiently managing heat exhaust from the modules. To that end, each module has a housing forming an interior and, to regulate air flow, an air inlet and corresponding air outlet. Each module also has a plurality of interior processing devices (e.g., servers, computers, etc.) undesirably generating heat. In various embodiments, the air outlets direct hot exhaust air of each module into the interior region. That hot exhaust air preferably interacts with the hot exhaust air from other modules to more effectively remove heat from the module interior. Details of various embodiments are discussed below.

Figure 1:
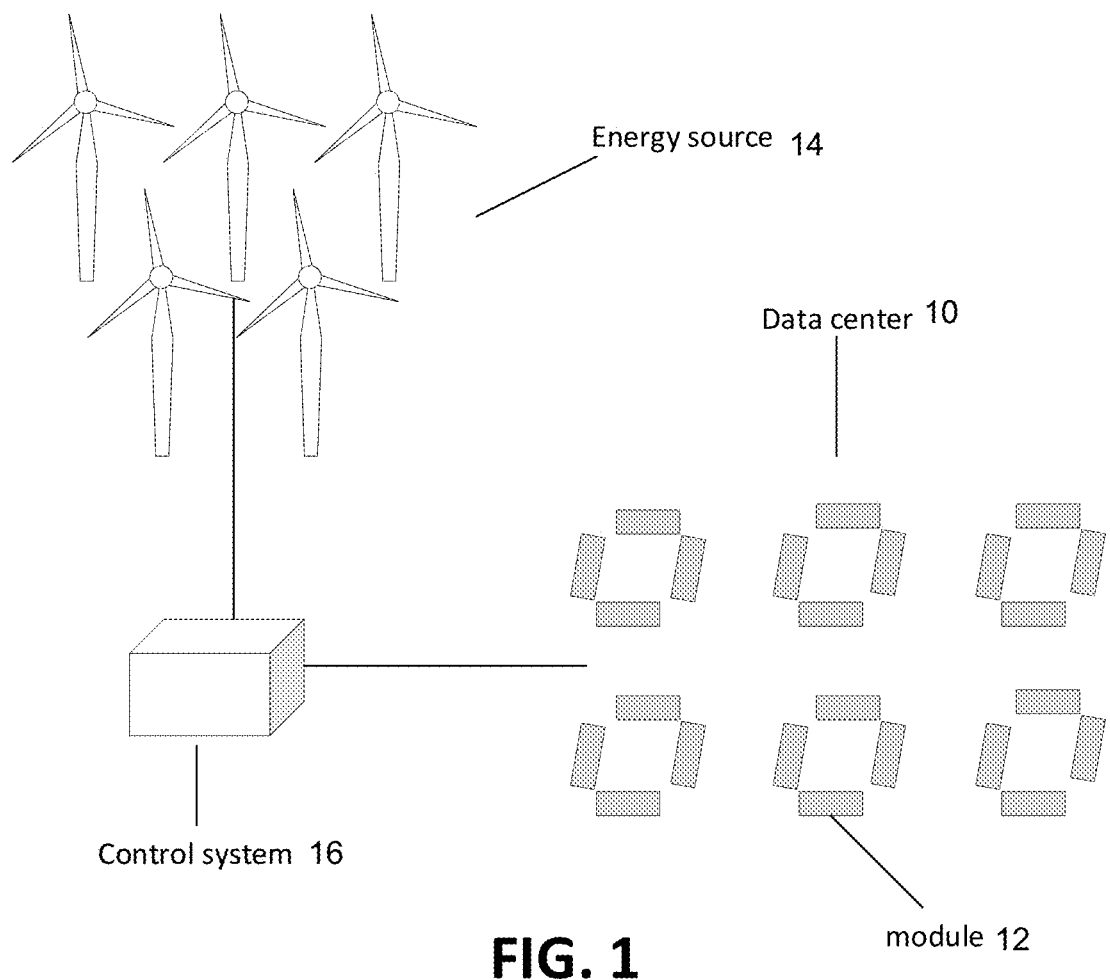
FIG. 1 schematically shows a data center in accordance with illustrative embodiments of the invention.

FIG. 1 schematically shows a data center 10 configured in accordance with illustrative embodiments of the invention. The data center 10 has a plurality of modules 12 arranged in a prescribed manner (discussed below) within a larger environment, and an energy source 14 to provide power to the modules 12, their internal electronic components (e.g., servers), and other data center components. In preferred embodiments, the energy source 14 is a renewable source, such as a wind energy farm (shown), solar farm, hydroelectric plant, etc.

In addition or alternatively, other embodiments may connect the data center 10 to a municipal or other conventional electric grid. This connection can be so-called "behind-the-meter" and/or "in-front-of-the-meter." For example, such embodiments may use electricity from the conventional electric grid at times when utility electricity costs are lower, and then use renewable power when utility electricity costs are higher. In fact, even when using the conventional grid, the renewable energy source can generate and store energy in batteries or other means for future use (e.g., when the conventional electric grid costs are high), and/or sell excess renewably produced energy back to the conventional electric grid. Those skilled in the art should appreciate that the data center 10 can utilize a variety of other renewable energy and/or non-renewable energy sources and as such, those discussed in this description are for illustrative purposes only.

The data center 10 also has a control system 16 that, among other things, stores and manages the supply of electricity generated by the energy source 14. To that end, the control system 16 supplies electricity to the above noted plurality of modules 12 via the noted energy source(s) 14. This control system 16 may be pre-programmed to automatically select when and which energy source to use (e.g., the grid or local renewable and/or a microgrid), amounts, etc. In addition, the control system 16 may have user interfaces to facilitate manual grid control, as well as control of various control functions for managing the modules 12 and their systems.

In various embodiments, some or all of the modules 12 are permanently built in the environment. For example, each module 12 may be constructed with conventional building techniques and products that make moving the module 12 substantially permanent (i.e., analogous to a conventional house or office building). For example, each module 12 may be placed on a cement pad or foundation and secured in a substantially permanent manner to the ground. Indeed, there are cumbersome and extraordinary ways to move a permanent structure, such as a house, and the module design in such embodiments may be subject to moving such ways.

In other embodiments, however, the modules 12 are secured to the environment in a manner where they may be more readily moved, analogous to a trailer or some mobile homes. Specifically, they may be sized and placed in the environment with equipment that makes module movement more available. For example, a given module 12 may be placed on a prepared portion of the ground at the desired location in the environment and nominally secured with stakes, fasteners, or other techniques. To move a module 12 (e.g., to fine tune their positions for optimal position relative to the prevailing wind), workers or others may simply remove any ground (removably) coupling equipment and move the module 12 to the desired new location.

To protect interior components (e.g., servers, computers, routers, etc.) from the environment, each module 12 has a housing 18 forming a thermally controlled interior. The module housing 18 of various embodiments may be implemented as a rectangular metal container, but may have other form factors and/or be formed from wood, plastic, concrete and other structural materials, or a combination of materials. Preferably, as noted below, the housings 18 have a sloped roof specially configured to manage airflow external, but proximate to, the module 12. The housing 18 thus is a substantially enclosed structure that shelters its interior components from the environment. In various embodiments, such as some of those noted above, the housing 18 is structured so that the module 12 is portable and thus, it can be transported to different locations.

To provide its core function, the interior of the housing 18 contains a plurality of processing devices. In various embodiments, among other things, the processing devices include computers, servers, networking equipment (e.g., switches and routers), as well as various information security elements, such as physical security devices and firewalls. Those skilled in the art should understand that these components are illustrative and there is a variety of hardware, software, and combinations of hardware and software that can establish the functional components of a processing device and related accessories. The processing devices contained within the modules 12 perform any of a variety of common functions to support applications, such as blockchain computing, blockchain or bitcoin mining, web services, video or other multi-media transmission, storage, and data management.

As known by those in the art, the plurality of devices within each module 12 generates substantial amounts of heat during use. Environmental factors, such as high outdoor temperatures or sun exposure, also may increase the temperature within the modules 12. Accordingly, each module 12 has a convective cooling system that directs air flow from an air inlet 20A (aka "air intake") on one side of the module 12 to an air exhaust or air outlet 20B (aka "exhaust outlet") on the opposite side. As shown in FIG. 1 (as well as FIG. 3A, discussed below in greater detail), the modules 12 preferably are arranged so that the air exhaust/outlet side of the three or more modules 12 faces a common area; namely, an open, interior region 22 formed by the three or more modules 12. FIG. 1, for example, shows six sets of four modules 12 (referred to below as "module sets") that each form this interior region 22. Air outlets 20B of each of the four modules 12 of each module set are directed toward the interior region 22. Preferably, the exhaust air of the four modules 12 interact and are urged upwardly from the modules 12.

Figure 2:
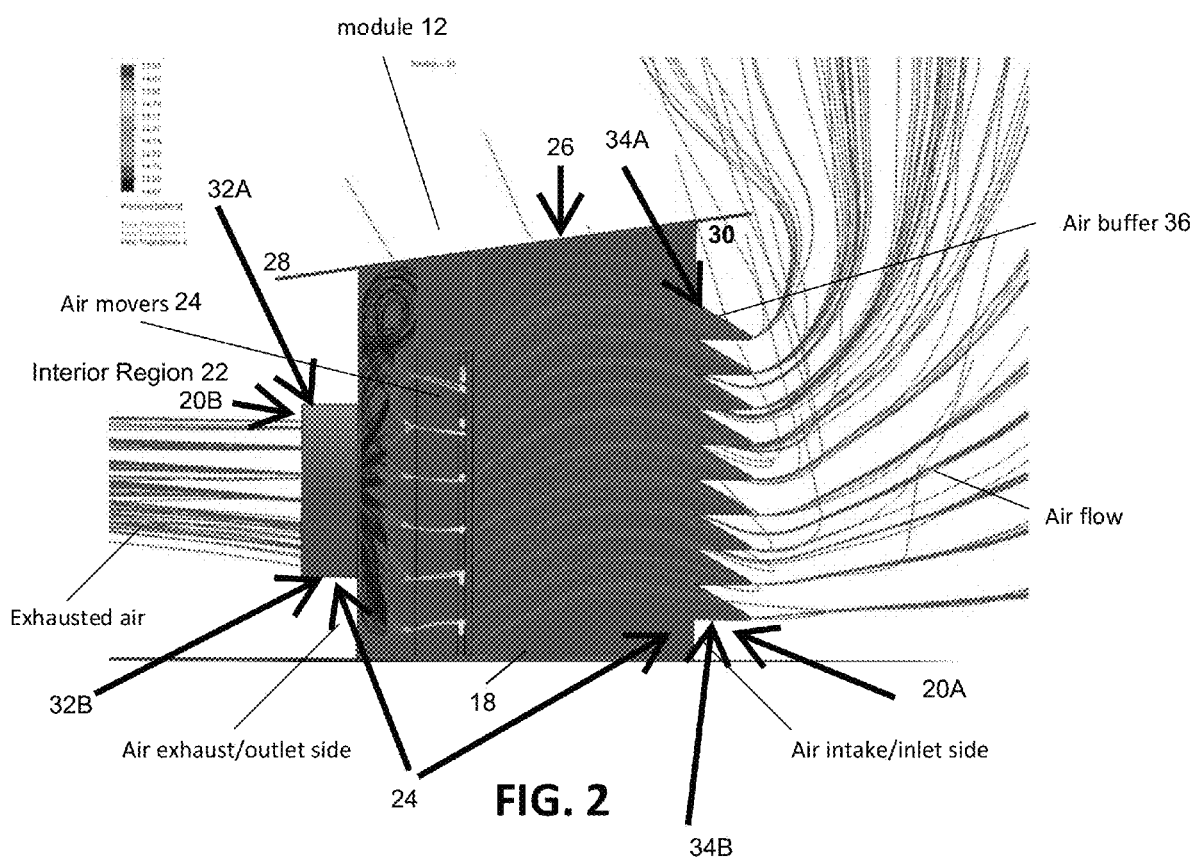
FIG. 2 schematically shows a diagram of the air flow and pressure of a single module of various embodiments.

In illustrative embodiments, each module 12 has a plurality of air movers 24 (e.g., one or more air movers 24 at or near the air inlet 20A, and one or more air movers at or near the air outlet 20B) that generate and control air flow within its interior. The air movers 24 can be passive or active devices and can include, among other things, fans, blowers, or turbines. Efficient regulation of internal module temperature mitigates heat-related damage and extends the useful life of the processing devices and, effectively the data center 10 itself. FIG. 2 schematically shows a diagram of the air flow of an exemplary single module 12. Flowing from right to left from the perspective of that figure, relatively cooler air enters the air inlet side of the module 12. The plurality of air movers 24 (schematically shown) within the modules 12 direct this cooler air through and/or around the processing devices. As it interacts with the devices within the module 12, the inlet air gathers heat from the components, effectively convectively cooling the components and housing interior. The air movers 24 then direct the heated air (i.e., heated by thermal convection as the inlet air traverses toward the air outlet 20B) to the air exhaust side of the housing 18, where the air is expelled into the internal region 22.

During use, however, the inventors discovered that hot air from the air outlet 20B undesirably may recirculate back, over the top of the housing 18, and back into the air inlet(s) 20A. This recirculation consequently can substantially inhibit the cooling benefits, potentially damaging the internal components. To mitigate this problem, however, the housing roof 26 preferably is oriented in a non-horizontal configuration. In this example, the roof 26 of the housing 18 is sloped or angled relative to the horizontal (i.e., the horizontal roughly being the ground upon which the module 12 is mounted). Setting the angle too shallow can let too much of the hot air recirculate, however, while setting the angle too steep can adversely impact overall airflow in other ways. After testing, the inventors discovered that roof angles of between and including about 5-20 degrees should provide satisfactory results. More precisely, roof angles of between and including about 10-15 degrees are expected to provide satisfactory results.

The roof 26 in this embodiment may be considered to have an interior edge 28 on the same side as the air outlet 20B, and an exterior edge 30 on the same side as the air inlet 20A. The interior edge 28 therefore may be adjacent to or extend into the interior region 22. As such, the distance from the exterior edge 30 to the interior region 22 is greater than the distance from the interior edge 28 to the interior region 22. As shown in FIG. 2, the interior edge 28 has a lower altitude (i.e., the distance in this case from the housing base to the interior edge 28) than that of the exterior edge 30. In other words, the distance from the base of the housing 18 to the interior edge 28 is smaller than the distance from the base of the housing 18 to the exterior edge 30. These edges 28 and 30 also can form overhangs, as shown in FIG. 2, or end at the wall forming the respective inlet and outlet sides of the housings 18 and thus, not form overhangs.

While the sloped roof 26 may suffice in some environments, the module 12 also may position and orient that air inlet 20A and air outlet 20B relative to each other in a manner that further mitigates air recirculation. Among other things, the air outlet 20B may be more concentrated, urging outlet air into the environment at a higher flow rate. In fact, these flow rates can be coordinated with other modules 12 in the same module set 31 (i.e., the three or more modules 12 forming a single interior region 22) to optimize thermal release and air flow. As such, the surface area permitting of the air inlet 20A (i.e., the open spaces permitting air to enter a housing 18/module 12) may be greater than that for the surface area forcing air out of the housing 18/module 12. In addition, the air inlet 20A may start at a higher altitude than those of the air outlet 20B. Specifically, in the embodiment of FIG. 2, the air inlet 20A is considered to have top and bottom air inlet edges 32A and 32B. In a corresponding manner, the air outlet 20B is considered to have top and bottom air outlet edges 34A and 34B. To mitigate undesired air recirculation, the inventors recognized that the altitude of the top air inlet edge 32A preferably is higher or greater than the altitude of the top air outlet edge 34A. In addition or alternatively, the altitude of the bottom air inlet edge 32B preferably is lower or less than the altitude of the bottom air outlet edge 34B.

Those skilled in the art can select the appropriate shape, area, configuration, and size of the air inlet 20A and air outlet 20B consistent with the teachings of this description. For example, the air inlet 20A and air outlet 20B each can be formed from a plurality of openings of prescribed size and shape. That size and shape can be a function of the desired air flow and pressures within the module housing 18. For example, the air inlet 20A can be formed from a plurality of horizontally oriented, rectangular openings. Preferred embodiments form the air outlets 20B in a position that minimizes the amount of air that changes direction between the air inlet 20A and the air outlet 20B. To that end, in a single module 12, the air inlet 20A preferably is in a region directly across from its corresponding air outlet 20B. For example, in a given module 12, the air inlet 20A may be defined on a wall forming the interior region 22 of the three or more modules 12, while the air outlet 20B may be on a wall opposite the wall containing the air inlet 20A (e.g., the wall farthest from the wall forming the air inlet 20A).

Each module 12 also may have a plurality of buffers or scaffolds ("buffer 36", e.g., on the roof 26 of the module 12 and/or integrated into the air inlet 20A) to further mitigate the amount of air that recirculates through the module 12 from the air outlet 20B. The buffer/scaffolds 36 of the embodiment of FIG. 2 may be implemented as hoods that block air coming downwardly directly into the air inlet openings in the side of the housing 18. In some embodiments, the interior of the modules 12 even may have a thermal barrier that separates the front of a rack containing heat generating components (e.g., the servers, computers, switches, etc.) from the back of the rack. This barrier still further mitigates hot air flow into the cooler rack side.

After experimentation, the inventors discovered that orienting the modules 12 so that their air exhausts direct air inwardly toward the interior region 22 enables more efficient air flow and cooler module temperatures. Among other benefits, this module formation mitigates the volume of exhausted air that recycles through the air flow systems of neighboring modules 12, and increases the efficiency of the air movers 24 directing air to the air outlet 20B/exhaust side of each module 12 due to limited wind resistance. In addition, the inventors recognized that in many instances, this configuration allows the heated air time to rise high enough before the wind directs it back toward an air inlet 20A. Ideally, by the time the wind has taken heated air and directed it towards an intake, that heated air is too high to be effectively drawn back into the air inlet 20A. Even with extremely high winds, however, the interior region 22 at least in part protects the exhaust pressure and velocity characteristics to some extent, enabling more effective operation.

Some embodiments orient the air movers 24 themselves (e.g., blowers) or configure the air movers 24 at the air outlet 20B to direct heated outlet air upwardly. For example, the air movers 24 at or near the air outlet 20B may direct air straight into the interior region 22 (i.e., horizontal to the base of the module 12), or upwardly at an angle of 1 or more degrees (e.g., up to 90 degrees from the horizontal). Satisfactory angles may include 10-45 degrees, 45-60 degrees, 60-90 degrees, or 5-90 degrees. To optimize airflow, the air movers 24 orient their outlet air stream to intersect that of one or more of the air streams from another module 12 forming the interior region 22. As such, the air streams combine and, with their inherent heat, flow upwardly at a more desirable rate. Logic or other components also may automatically or dynamically adjust the angle of the air mover outlet stream to optimize cooling. Among other things, the angle can be a function of the weather, the operation of other modules 12 in its set of modules 12 (the set of modules 12 referred to as a "module set 31"), the components being cooled, and environment. Moreover, in addition to being movable in the Z-direction (i.e., vertically), the air movers 24 may be movable in the X/Y plane (i.e., horizontally) or along all three axes.

As noted, a set of three or more modules 12 are oriented relative to each other to form the noted interior region 22. While being open to the sky, these modules 12 are positioned not to form a laterally closed interior region 22. Instead, in preferred embodiments and as shown in various figures, adjacent modules 12 are spaced apart so that they form lateral spaces 38. As such, the modules 12 may be considered to at least in part form a circumferentially open space that defines the interior region 22. It should be noted that circumferentially open implies that the region around the module set 31 has at least one opening and is not necessarily rounded (i.e., it can be a rectilinear shape or other shape, as discussed below).

More specifically, in the examples shown in various figures, each module 12 is considered to be adjacent to and between two other modules 12. This adjacency is open, however, to form the lateral spaces 38. These lateral spaces 38 may be considered to be formed by the closest portions of the modules 12 to each other. For example, top two modules 12 (from the perspective of the drawing) schematically shown in FIG. 3A have adjacent vertical edges next to, but spaced apart from, each other. These two edges laterally open the interior region 22 and at least in part form the lateral space 38 between the top two modules 12. The bottom two modules 12 in this figure have the same relationship and, as shown, each module 12 has another lateral space 38 on its other side. Accordingly, the adjacent housing portions may be considered to form the lateral spaces 38. As such, the lateral spaces 38 may be considered to end at the respective roofs 26 of the modules 12. The overhangs, if any such as that shown in FIG. 2, may extend higher or into the lateral space 38.

The inventors discovered that closing the interior region 22 undesirably may produce a pressure differential that causes the "chimney effect." Instead of that, however, in the absence of different pressures at the air outlets 20B, illustrative embodiments mitigate significantly different pressures between the top of the interior region 22 and the lower portions of the interior region 22. In other words, ignoring the air outlet pressures, the pressure within the inlet region preferably is about the same as or close to that of the environment. As such, the lateral spaces 38 between modules 12 were determined to provide the desired benefit of efficiently removing outlet air. This pressure equalization configuration has delivered satisfactory results that provide an improved benefit in various environments when compared to potential designs without the lateral spaces 38 (closed lateral designs).

Figure 3A:
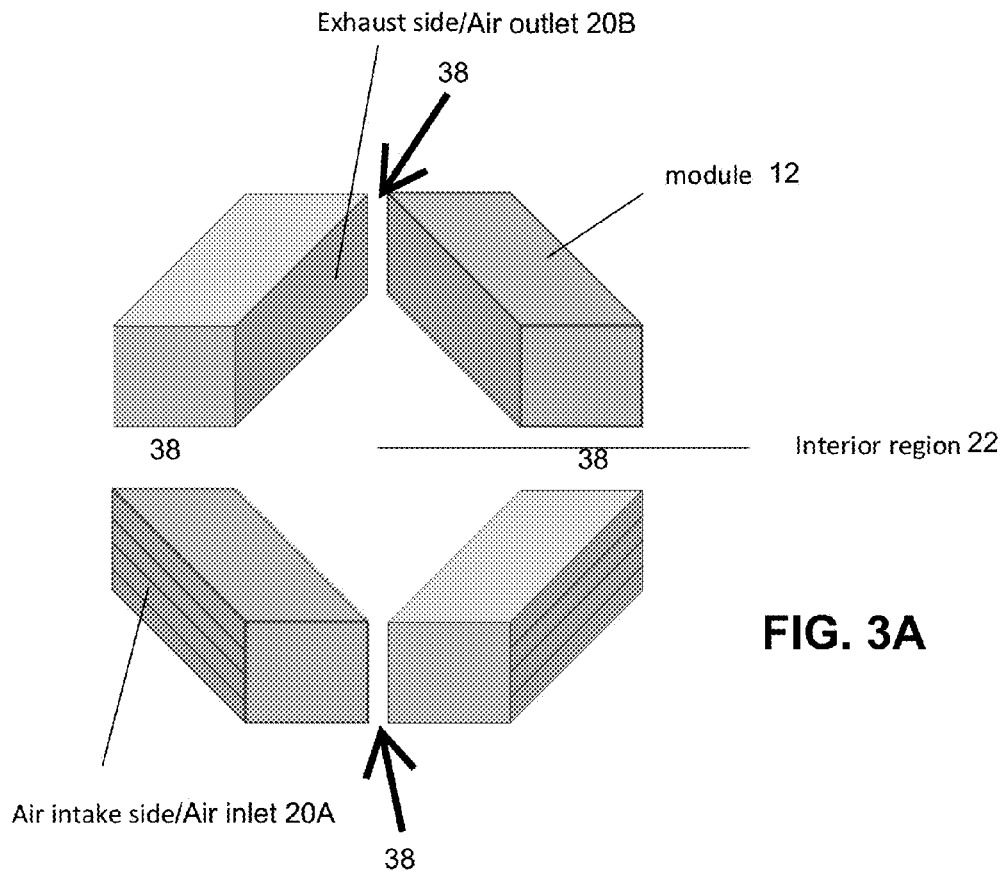
FIG. 3A schematically shows an arrangement of four modules configured in accordance with illustrative embodiments of the invention.
Figure 3B:
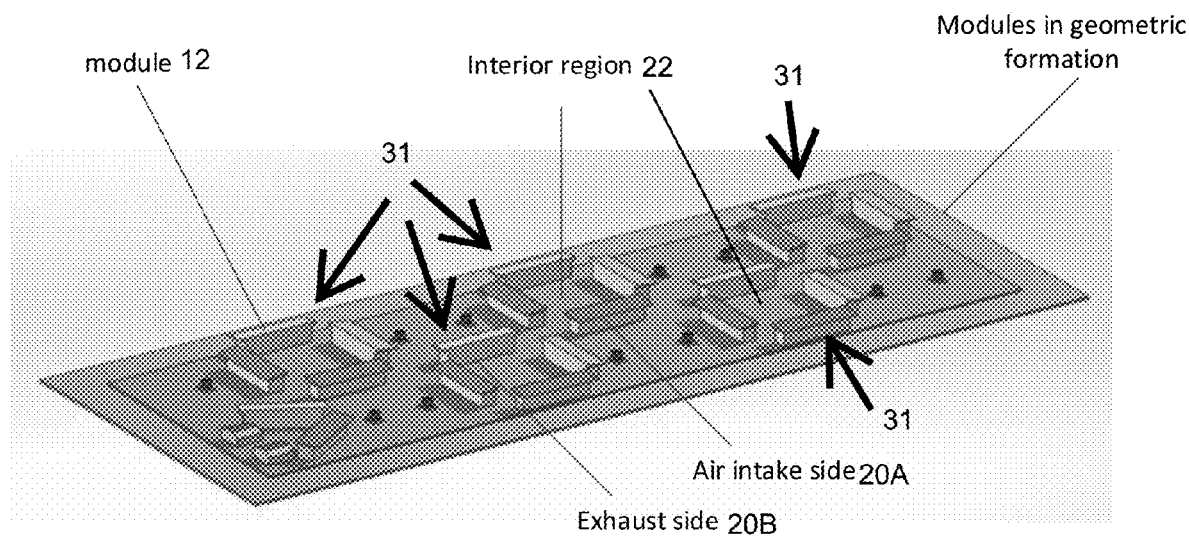
FIG. 3B schematically shows a series of module formations arranged in accordance with illustrative embodiments of the invention.
Figures 4A, 4B:
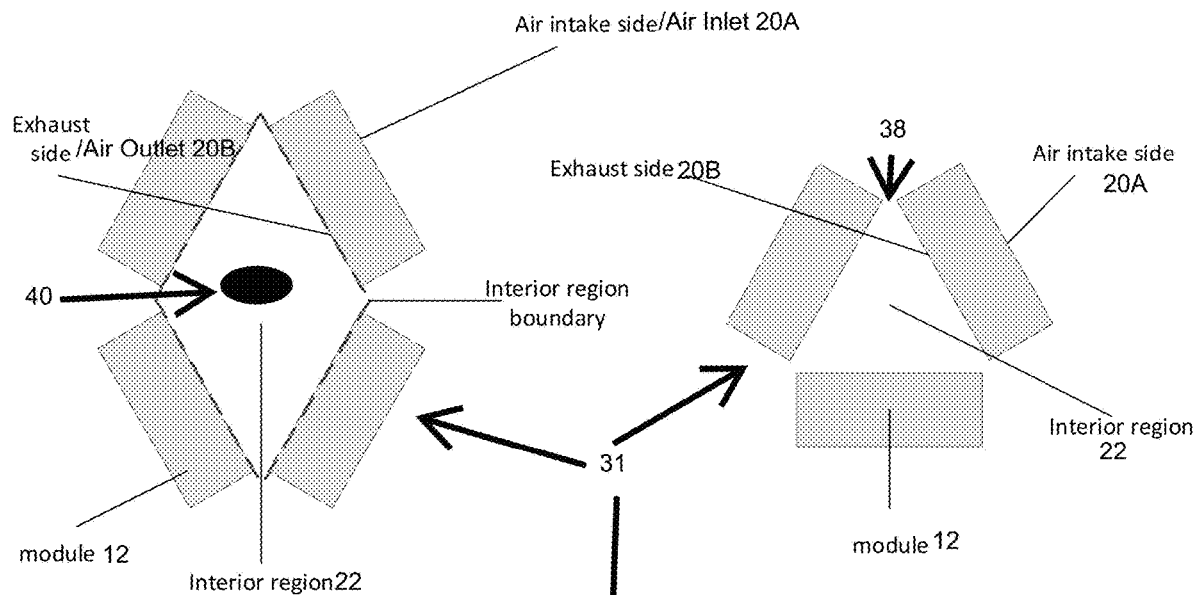
FIG. 4A schematically shows a plan view of four modules configured such that the exhaust side of each module points toward an interior region in accordance with illustrative embodiments.
FIG. 4B schematically shows a plan view of three modules configured such that the exhaust side of each module points toward an interior region in accordance with illustrative embodiments.

FIG. 3A schematically shows an exemplary arrangement of four modules 12 with their exhaust sides (i.e., a side with the air outlet 20B), forming the interior region 22 in a diamond shape. In a similar manner, FIG. 3B shows multiple rectangular module sets 31 in another arrangement. In illustrative embodiments, with rectangular or similar housings 18, the wall of the module 12 having the exhaust side of each module 12 may be considered to form a plane, and the intersection of each such plane creates the boundaries of the interior region 22. The boundary thus defined by the planes of the modules 12 forms a geometric shape (e.g., rectangle, diamond, pentagon, hexagon, ring, oval, or rhombus). In some embodiments, the shape created by the plane boundaries can be irregularly shaped. Indeed, while these planes intersect, the interior region 22 is not a laterally closed region—it has one or more openings. FIG. 4A schematically shows a plan view of four modules 12 organized with exhaust sides generally pointing toward the interior region 22. The interior region 22 boundary created by the planes of each module 12, in this example, resembles a rhombus or diamond.

More specifically, unlike other figures, for illustrative purposes, FIG. 4A expressly shows this effective region with the planes extended by extension lines that are in the drawing only—these extension lines are in the drawings to simplify the discussion. These extension lines, when extended, show the intersection of the various planes and how the interior region 22 forms a plurality of concave regions, particularly at the intersections. Similar interior regions 22 also may be considered to be formed when the modules 12 do not have planar sides forming the interior region 22.

Figure 4C:
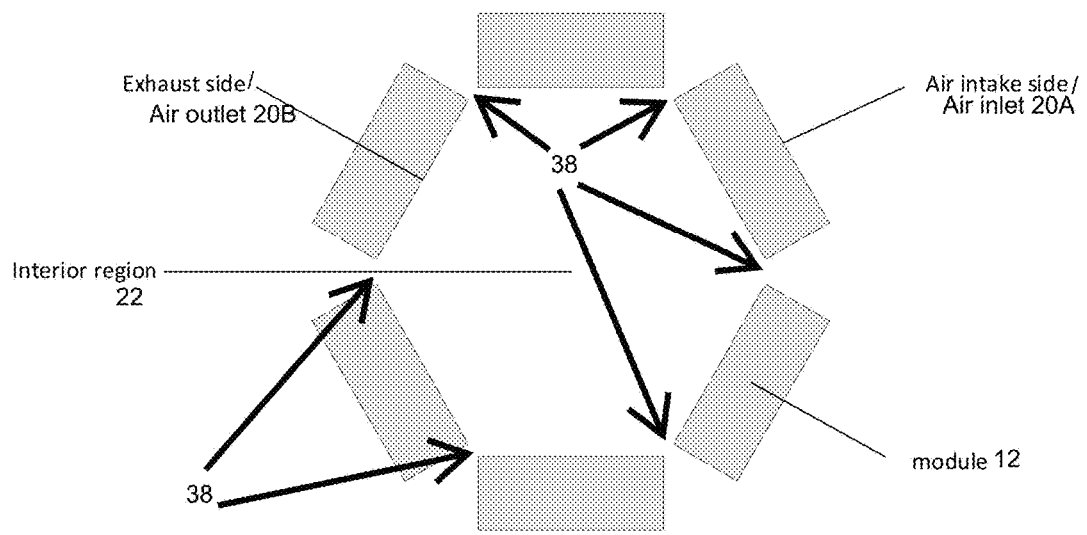
FIG. 4C schematically shows a plan view of six modules organized such that the exhaust side of each module points toward an interior region in accordance with illustrative embodiments.

A person of ordinary skill in the art will recognize that the boundary of the interior region 22 can be defined by three, four, or five or more modules 12 within the scope of the disclosure. For example, in FIG. 4B, the interior region 22 is triangular. Alternatively, in FIG. 4C, six modules 12 are oriented to form a hexagonal interior region 22. As in other embodiments, these figures expressly show the exhaust sides of the modules 12 facing the noted interior region 22, and the air inlet side, opposite the exhaust side, pointing away from the interior region 22.

In preferred embodiments, the interior region 22/modules 12 in the module set 31 forming the interior region 22 are in the shape of a diamond with the two modules 12 forming an acute angle forming an effective point. To enhance performance, this point is generally pointing in the direction of the prevailing wind of the environment in which the modules 12 are located. Specifically, that effective point preferably is aligned with an points in the general direction of the usual wind in the environment or region—i.e., the "prevailing wind" referring to the most common direction of the wind (e.g., wind blowing east to west).

Some embodiments also may have a flow diverter 40 (FIG. 4A) within the interior region 22 configured to direct outlet air in a prescribed direction. For example, the flow diverter 40 may direct air upwardly. To that end, the flow diverter 40 may have surface features (e.g., concavities, convex surfaces, etc.), that direct fluid/air in the desired manner. As another example, the flow diverter 40 may have a pyramidal shape.

Some or all of the outlet air movers 24 thus may direct their air flow toward the flow diverter 40 in a prescribed manner, such as directly at the flow diverter 40 or indirectly at the flow diverter 40. Some embodiments may direct the outlet air movers 24 to direct flow away from the flow diverter 40. Thus, for these and other reasons, the flow diverter 40 may be positioned in the general center of the interior region 22, or offset from the center. In some embodiments, a plurality of like or unlike flow diverters 40 can be deployed within the interior region 22 to provide a more complex flow pattern. These flow diverters 40 can cooperate as if a single flow diverter 40, or operate independently as specified by the data center requirements.

While modules 12 preferably form the interior region, some embodiments may use one or more natural and/or artificial structure(s) to in-part form/define the interior region 22. For example, among other things, a set of rocks, a set of trees, a brick or wood wall, an empty module housing 18, trailer, or other object can form a portion of the boundary of the interior region 22.

In alternative embodiments, a single module 12 can be constructed in a geometric shape (or irregular shape) as discussed above with an interior region 22 that can perform a similar function. For example, this embodiment of the single module 12 may form a toroid, diamond, rhombus, etc., with an open interior region 22.

The inventors discovered that this configuration of modules 12 also reduces the resulting noise from the air outlet 20B. Specifically, air expelling through the air exhaust side of the module 12 creates substantial amounts of noise at the site of the data center 10—air expelling into an uncontrolled environment can cause this issue. Mitigating noise by facing the exhaust side of each module 12 in the arrangement toward the interior region 22—so air flow can be managed after expelled via the outlet—thus favorably reduces exhaust noise throughout the data center 10.

In other embodiments, the air outlet 20B on one or more of the modules 12 may be on a different part of the module, such as at the top of the module 12. Some such embodiments may have air moving devices directing flow toward the interior region 22. As with other embodiments, the interior region 22 is formed by one wall of each module 12—in this case, an interior wall without the air outlet 20B. In other embodiments, the air outlet 20B can be at/in different areas of different modules 12. For example, one module 12 can have the air outlet 20B on its top/roof 26 while others may have the air outlet 20B on the interior facing wall.

Returning to FIG. 3B, the data center 10 of this example may be considered to have module sets 31 that each forms an interior region 22. Each set 31 may be formed from modules 12 that are identical to or different than those of the other sets. Unlike the embodiment of FIG. 1, the sets of modules 12 are offset from each other in a non-linear pattern. In other words, this plurality of module sets 31 do not form a straight line of three or more module sets 31—instead, it is more of a zig-zag pattern. This arrangement beneficially spaces apart the module sets 31 to minimize the heated outlet air from being fed into air inlet(s) 20A of a neighboring module set 31. For example, the far three sets starting from right to left may be identified as first, second and third module sets 31. If positioned too close together, it is more likely that heated air from any of those sets may feed into the inlet(s) of the other. Rather than waste real estate, however, this data center 10 positions the second module set 31 diagonally or otherwise offset in a manner that minimizes the undesired hot air feedback from the other two module set(s) 31. Thus, the first and third module sets 31 are far apart to minimize feedback risk while the second module set 31 is offset to mitigate its impact to or from the first and third module sets 31.

Figure 5:
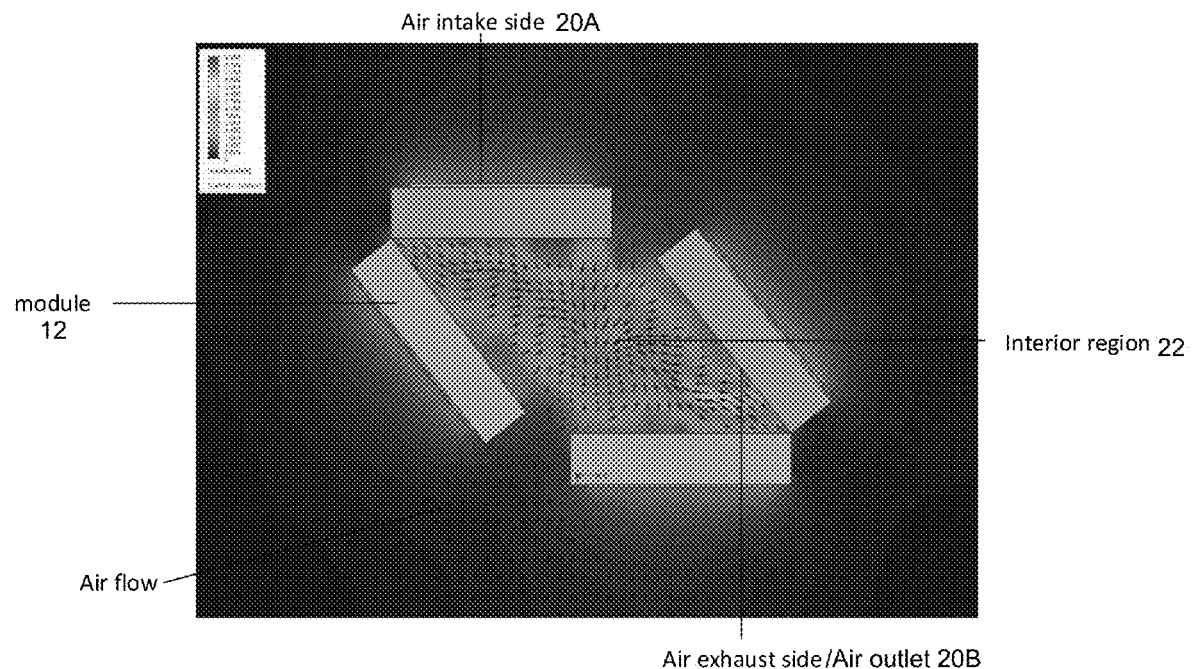
FIG. 5 schematically shows as arrows the air flow of various embodiments of the invention.

FIG. 5 schematically shows, as arrows, the air flow of various embodiments of the invention. The arrows in this figure depict exemplary air flow pointing in the direction that air runs through the modules 12. The colored background of FIG. 5 is coordinated to a temperature legend depicting the various temperatures of the air as it flows through the modules 12. As air enters the module 12, the air movers 24 circulate the air within the module 12 and direct it through the air outlet 20B into the interior region 22. The modules 12 thus receive a fresh air flow through the externally-facing air inlet 20A and, as shown and discussed above, the air outlet 20B of each module 12 is directed toward the air outlets 20B of the other modules 12. As noted, in preferred embodiments, the interior region 22 is an open air region with the noted lateral spaces 38. In other words, the interior region 22 is at least partly uncovered or otherwise unconfined beyond the planar geometric shape created substantially by the modules 12. A person skilled in the art will appreciate that the interior region 22 also can be partially or fully covered or otherwise contained. Moreover, in some embodiments, the modules 12 and/or interior region 22 can have walls or other fluid directing devices to further optimize airflow or serve another purpose (e.g., heat elements for water, turn turbines, turn a mill, etc.). In fact, some embodiments can use a wall or other non-module structure as one or more units that form the interior region 22. For example, the module set 31 of FIG. 5 could have two modules (e.g., the top and bottom modules in the figure), and two walls or empty shells (e.g., the left and right structures).

Figure 6:
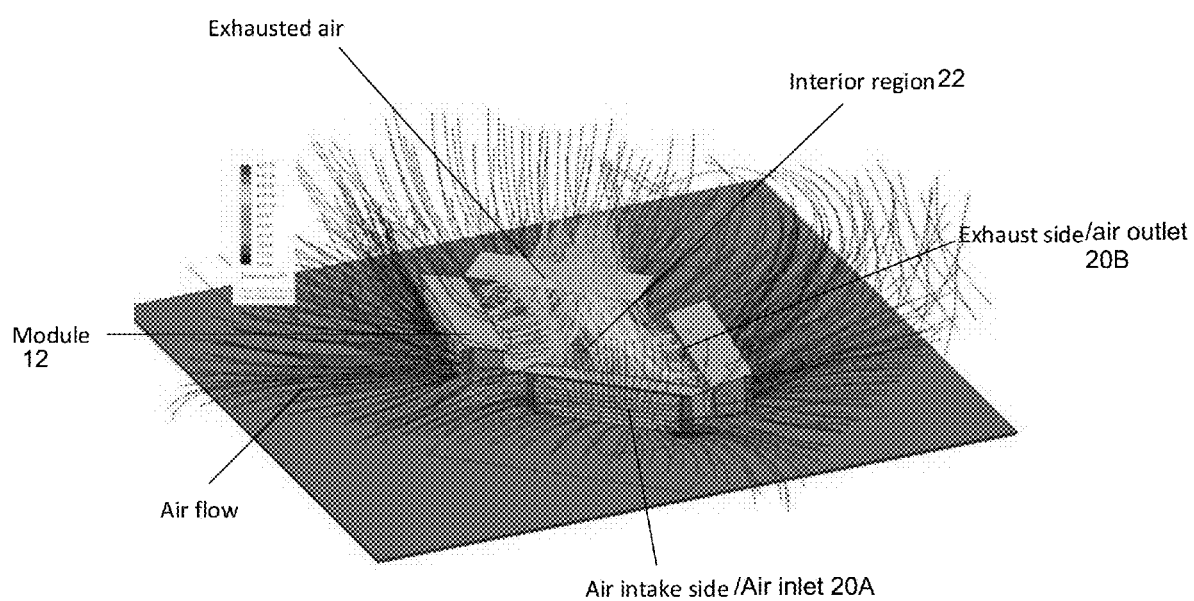
FIG. 6 schematically shows the temperature of air flowing through a plurality of modules in accordance with illustrative embodiments of the invention.

FIG. 6 schematically shows another visualization of air flow in illustrative embodiments. The temperature and flow of the air in this drawing is represented by lines that are color-coordinated to a temperature legend to reflect temperature changes. As shown and discussed above, cooler air flows into the modules 12 through the air inlet sides and out into the interior region 22 from the air outlets 20B. The temperature of the air increases as it flows through/around the processing devices within the module 12, and is ultimately expelled as hot air from the exhaust side of the module 12. The orientation of the modules 12 creates an effective stream of combined exhaust flow of hot exhausted air that rises from the interior region 22 into the environment. In various embodiments, the exhausted air is pushed away by wind and/or natural airflow. The buffers 36 on the air inlet side of each module 12 and module set configurations mitigate the amount of exhausted air undesirably recycled through the air flow system of the modules 12. Moreover, as noted above, a scaffold on the module roof 26 or other region, which directs air flow, with or without baffles, can mitigate hot air from mixing with the colder air on another physically spaced apart area of the system.

Figure 7:
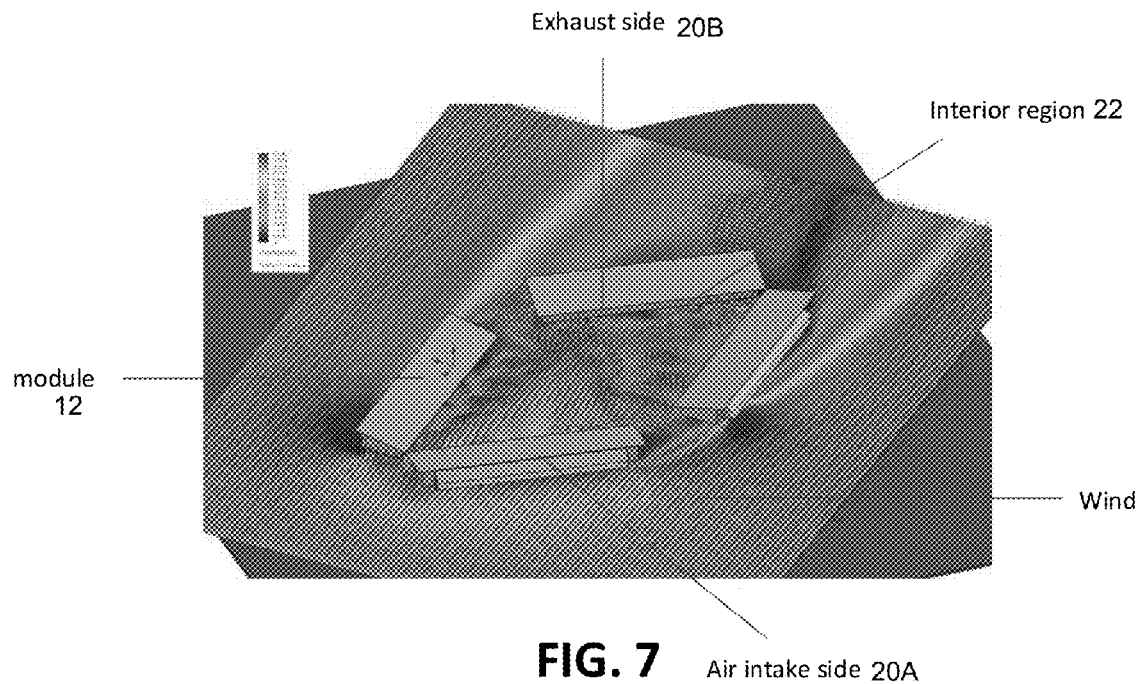
FIG. 7 schematically shows air velocity, with red colors being faster speeds, over a formation of modules in accordance with illustrative embodiments.

FIG. 7 schematically shows an exemplary representation of air velocity in various embodiments. This type of representation may show how the interior region 22 is significantly shielded from external wind (e.g., the external wind may have a negligible impact on the interior region 22). The color of the air is coordinated to a speed legend. The formation of the modules 12 allows the wind to flow directly into the air inlet side of some of the modules 12, while the exhaust side of each module 12 is at least partially shielded from wind by the other modules 12 in the formation, thus bolstering the efficiency of the air movers 24 expelling air from the modules 12. The combined exhaust air rises and may be drawn away by the wind.

Figure 8:
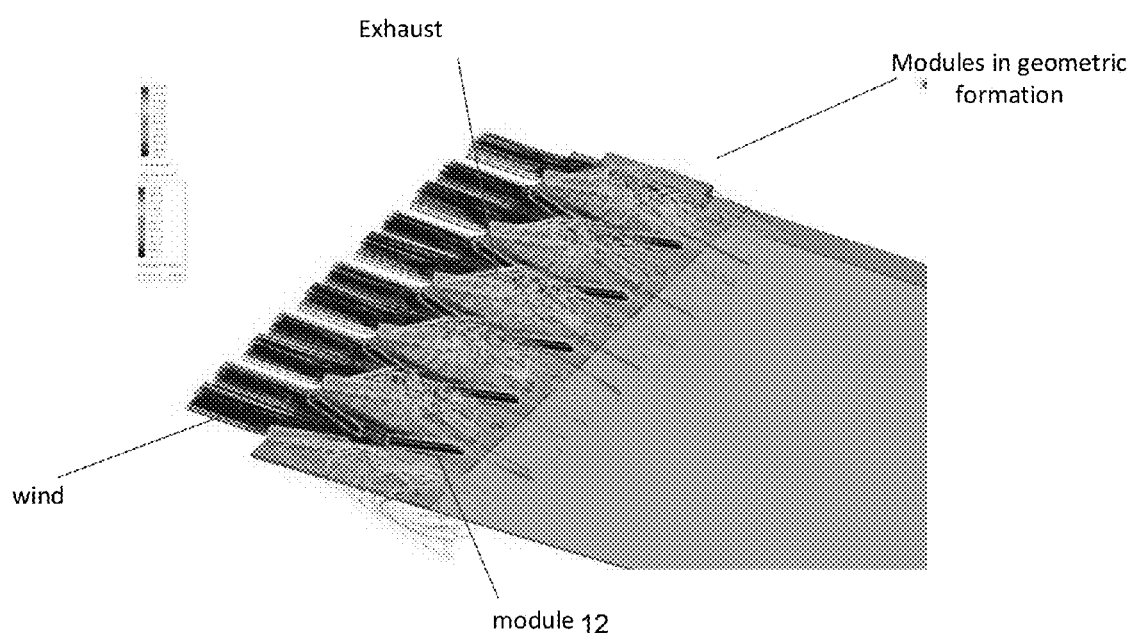
FIG. 8 schematically shows the temperature and air flow of a series of module formations in accordance with illustrative embodiments of the invention. This figure also shows how interior regions are protected from the wind.

FIG. 8 schematically shows a series of module set formations while the wind is blowing in a different direction from that of FIG. 7. This figure also shows how relatively closely spaced modules 12 tightly protect from the wind, and how the air inlet(s) 20A of neighboring modules 12 are protected from the exhaust. This also shows diamond shaped module sets 31/interior regions 22 with the acute sides generally aligned with (or pointing into) the prevailing winds.

As such, the air flow is depicted by lines that are color-coordinated to a temperature legend. In a manner similar to other figures, the wind blows into the air inlet sides of the modules 12 in each formation, while the exhaust sides expel hot air into the interior region 22, creating the noted exhaust. The wind further pushes the stream of hot exhaust over and away from the series of module formations. The modules 12 on the back side of the formation thus avoid intake of hot exhausted air, increasing the efficiency of the cooling system within each module set 31 within the data center 10.

Figure 9:
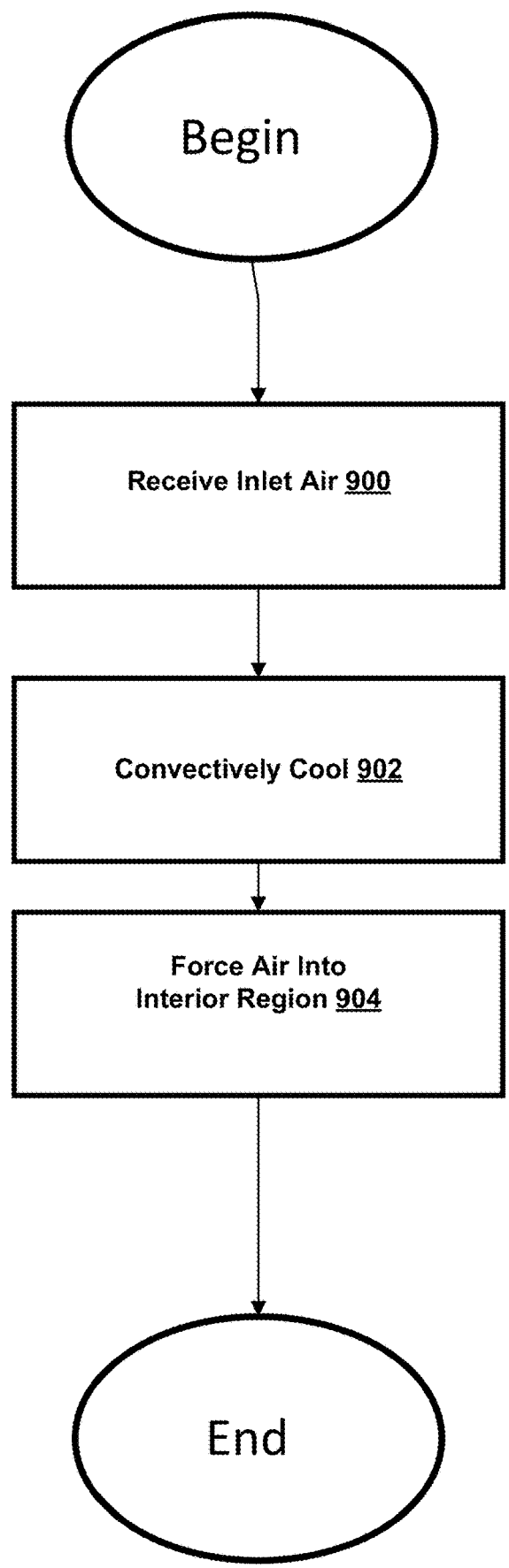
FIG. 9 shows a process of convectively cooling a data center in accordance with illustrative embodiments.

FIG. 9 shows a process of convectively cooling the data center 10 discussed above (and similarly structured other data centers) in accordance with illustrative embodiments. It should be noted that this process is simplified from a longer process that normally would be used to cool components in the data center 10. Accordingly, the process may have additional steps that those skilled in the art likely would use. In addition, some of the steps may be performed in a different order than that shown, or at the same time. Those skilled in the art therefore can modify the process as appropriate.

Moreover, as noted, many of the materials and structures noted are but one of a wide variety of different materials and structures that may be used. Those skilled in the art can select the appropriate materials and structures depending upon the application and other constraints. Accordingly, discussion of specific materials and structures is not intended to limit all embodiments.

The process of FIG. 9 begins at step 900, in which one or more modules 12 in a module set 31 receive cool air at their respective air inlets 20A. This air then is forced over and about various heat producing components (e.g., servers, computers, etc.) to provide convective cooling (step 902). To that end, the modules 12 each have internal fluid/air flow equipment (e.g., air movers 24 or air guides) within the module interiors to direct air in a desired manner. As the air passes through the module 12 and over heat producing equipment, it absorbs heat, and is forced out of the module 12, via the air outlets 20B, into the interior region 22 (step 904). Although the convectively cooling air may make some turns within the module interior, the air inlet 20A and air outlet 20B preferably form a substantially straight line, or at least a portion of the air inlet 20A and a portion of the air outlet 20B form a straight line. Other embodiments, however, may not form such a straight line.

Those skilled in the art may use various embodiments in areas other than data centers 10. For example, various embodiments may be used in manufacturing factories, chemical production plants, semiconductor fabs, office buildings, etc. Such other embodiments, however, likely require customization not discussed above.

The embodiments of the invention described above are intended to be merely exemplary; numerous variations and modifications will be apparent to those skilled in the art.

What is claimed is:

1. A data center configured to be positioned in an environment, the data center comprising:
a plurality of modules, each module comprising:
a housing configured to contain a plurality of processing devices that generate heat during operation, and an air mover,
each module comprising an air inlet positioned on a first side of the housing and configured to receive air from the environment, each module also having an air outlet positioned on a second side of the housing configured to exhaust air from the housing using the air mover,
at least three modules of the plurality of modules spaced apart to form lateral spaces between adjacent modules, the plurality of modules forming an interior region configured to receive the exhausted air of the at least three modules,
each air mover being configured to generate a pressure differential between a top portion of the interior region and a bottom portion of the interior region using the exhausted air,
the lateral spaces being configured to reduce the pressure differential between the top portion of the interior region and the bottom portion of the interior region.

2. The data center as defined by claim 1, wherein the modules are positioned in an environment having an environmental pressure, the top portion of the interior region having a pressure that is substantially the same as the environmental pressure.

3. The data center as defined by claim 1 wherein each module has a roof, at least two of the plurality of modules having a sloped roof with an interior edge and an exterior edge, the interior edge being adjacent or extending into the interior region, the exterior edge being outside of the interior region, the interior edge having a lower altitude than an altitude of the exterior edge.

4. The data center as defined by claim 1 wherein each air inlet has a top inlet edge and each air outlet has a top outlet edge, the air outlets of the plurality of modules configured to direct air flow into the interior region, the air inlets being spaced from the interior region, the top outlet edge of each module being lower in altitude than its respective top inlet edge.

5. The data center as defined by claim 1 wherein a given module has a given air inlet, a given air outlet, and an air buffer adjacent to the given air inlet, the air buffer configured to mitigate recirculation of the exhausted air from the given air outlet back to the given air inlet.

6. The data center as defined by claim 1 wherein the plurality of modules define the interior region at least in part with the lateral spaces, the lateral spaces being defined by adjacent housing portions of two modules.

7. The data center as defined by claim 1 wherein each module comprises an outlet air mover configured to direct air from the air inlet, through the housing and out the air outlet upwardly at an angle of between about five and ninety degrees to a horizontal within the interior region.

8. The data center as defined by claim 1 further comprising a flow diverter within the interior region and configured to direct outlet air upwardly.

9. The data center as defined by claim 1 further comprising a plurality of additional modules, each of the plurality of additional modules comprising an additional housing configured to contain a plurality of additional processing devices that generate heat during operation, the plurality of additional modules forming second and third interior regions, the interior regions being positioned in an offset, nonlinear pattern.

10. The data center as defined by claim 1 wherein the air outlet of each of the at least three modules are on one side of the housing, the air outlets forming exhaust sides of each of the at least three modules, each of the exhaust sides forming part of a boundary of the interior region.

11. The data center as defined by claim 1 wherein the interior region forms a rectangle, diamond, or a rhombus.

12. The data center as defined by claim 1 further comprising a plurality of baffles configured to mitigate an amplitude of a sound of air flowing through the air outlet.

13. A data center configured to be positioned in an environment, the data center comprising:
at least three modules configured to contain a plurality of processing devices, each of the at least three modules being adjacent to two other modules to form lateral spaces,
the at least three modules positioned in the environment to form an interior region,
the interior region forming a plurality of concavities defined by the at least three modules,
each module having a sloped roof extending at an angle upwardly from the interior region, the sloped roof converging in a direction of the interior region with roofs of other modules forming the interior region,
each module including an air mover configured to urge airflow from a first side of the module and exhaust air directly into the interior region by way of a second side of the module, and configured to generate a pressure differential between a top portion of the interior region and a bottom portion of the interior region using the exhausted air,
the lateral spaces being configured to reduce the pressure differential between the top portion of the interior region and the bottom portion of the interior region.

14. The data center as defined by claim 13 wherein each module has an air inlet with a top inlet edge and an air outlet with a top outlet edge, the air outlets of the at least three modules configured to direct air flow into the interior region, the air inlets being spaced from the interior region, the top outlet edge of each module being lower in altitude than its respective top inlet edge.

15. The data center as defined by claim 13 wherein a given module has a given air inlet, a given air outlet, and an air buffer adjacent to its air inlet, the air buffer configured to mitigate recirculation of exhausted air from the given air outlet back to the given air inlet.

16. The data center as defined by claim 13 wherein each module comprises an air outlet, the data center further comprising a plurality of baffles configured to mitigate an amplitude of a sound of air flowing through air outlets.

17. The data center as defined by claim 13 wherein the interior region has a diamond shape.

18. A method of thermally managing a data center having a plurality of modules forming an interior region with at least one lateral space, the plurality of modules being in an environment, the method comprising:
receiving air from the environment via a plurality of air inlets exposed to the environment and spaced from the interior region, the plurality of air inlets being positioned on a first side of each the plurality of modules;
directing the received air through the plurality of modules to absorb heat from processing devices that generate heat, a temperature of the received air increasing as it absorbs heat to produce heated air;

forcing the heated air directly from the plurality of modules into the interior region by way of a plurality of air outlets, the plurality of air outlets being positioned on a second side of the plurality of modules;

generating a pressure differential between a between a top portion of the interior region and a bottom portion of the interior region in response to forcing the heated air into the interior region; and reducing the pressure differential between the top portion of the interior region and the bottom portion of the interior region by transferring at least a portion of the heated air from the interior region into the environment using the at least one lateral space.

19. The method as defined by claim 18 further comprising mitigating an amplitude of a sound of the received air as the received air enters the modules.

20. The method as defined by claim 18 further comprising receiving inlet air at a higher altitude than an altitude the heated air is forced from the modules.

21. The method as defined by claim 18 wherein forcing the heated air comprises directing the heated air upwardly relative to a horizontal.

22. The method as defined by claim 18 further comprising using a plurality of air buffers outside of the interior region to at least partially obstruct the heated air from reentering the plurality of modules via air inlets in the plurality of modules.

23. The method as defined by claim 18, the environment having a prevailing wind, the interior region being shaped like a diamond having a narrower end receiving the prevailing wind.

* * * * *